United States Patent
Hanawa

(10) Patent No.: US 12,061,242 B2
(45) Date of Patent: Aug. 13, 2024

(54) VEHICLE ELECTRIC POWER CONTROL APPARATUS

(71) Applicant: SUBARU CORPORATION, Tokyo (JP)

(72) Inventor: Takahiro Hanawa, Tokyo (JP)

(73) Assignee: SUBARU CORPORATION, Tokyo (JP)

( * ) Notice: Subject to any disclaimer, the term of this patent is extended or adjusted under 35 U.S.C. 154(b) by 12 days.

(21) Appl. No.: 18/175,866

(22) Filed: Feb. 28, 2023

(65) Prior Publication Data
US 2023/0296692 A1 Sep. 21, 2023

(30) Foreign Application Priority Data
Mar. 17, 2022 (JP) ................. 2022-042670

(51) Int. Cl.
*G01R 31/52* (2020.01)
*B60R 16/033* (2006.01)
*G01R 19/00* (2006.01)

(52) U.S. Cl.
CPC ............ *G01R 31/52* (2020.01); *B60R 16/033* (2013.01); *G01R 19/0092* (2013.01)

(58) Field of Classification Search
CPC .. B60L 1/00; B60L 3/04; G01R 31/52; G01R 19/0092; B60R 16/033
See application file for complete search history.

(56) References Cited

U.S. PATENT DOCUMENTS

2020/0324719 A1* 10/2020 Mahmoud ............... H04L 12/10

FOREIGN PATENT DOCUMENTS

JP 2001-327068 A 11/2001

* cited by examiner

*Primary Examiner* — Carlos Amaya
(74) *Attorney, Agent, or Firm* — Rimon P.C.

(57) ABSTRACT

A vehicle electric power control apparatus includes semiconductor fuses, current sensors, an interlayer short-circuit determination unit, and a switching unit. The semiconductor fuses are disposed between a vehicle power supply and respective vehicle auxiliary devices. The current sensors detect current values flowing through the respective semiconductor fuses. The interlayer short-circuit determination unit makes a determination as to occurrence of an interlayer short-circuit between any of the semiconductor fuses and a corresponding one of the vehicle auxiliary devices, on the condition that a second current detection value inputted from the corresponding one of the vehicle auxiliary devices differs from an allowable value of a first current detection value inputted from a corresponding one of the current sensors. The switching unit switches, to off-operation, the any of the semiconductor fuses on a path related to the determination as to the occurrence of the interlayer short-circuit.

4 Claims, 5 Drawing Sheets

VEHICLE ELECTRIC POWER CONTROL APPARATUS

CROSS-REFERENCE TO RELATED APPLICATIONS

The present application claims priority from Japanese Patent Application No. 2022-042670 filed on Mar. 17, 2022, the entire contents of which are hereby incorporated by reference.

BACKGROUND

The disclosure relates to a vehicle electric power control apparatus.

As an existing vehicle electric power control apparatus, for example, an apparatus described in Japanese Unexamined Patent Application Publication (JP-A) No. 2001-327068 is known.

In a vehicle electric power control apparatus, a vehicle wiring system supplies electric power to electric power loads of a vehicle. In the vehicle wiring system, a fuse element and a PTC element are provided in series on the way of a wiring. If an abnormal current flows through the wiring, the fuse element is melted before the wiring is damaged. Meanwhile, if the abnormal current flow causes a sudden rise in a resistance value, the PTC element reduces the current flowing through the wiring before the melting of the fuse element at latest.

With this structure, in the vehicle electric power control apparatus, the number of the melted fuse elements is reduced even in the case where the abnormal current flows through the wiring. This makes it easier to find the melted fuse elements and replace them with new ones, leading to reduction in repair time and work.

SUMMARY

An aspect of the disclosure provides a vehicle electric power control apparatus configured to control electric power to be supplied to vehicle auxiliary devices from a vehicle power supply mounted on a vehicle. The vehicle electric power control apparatus includes semiconductor fuses, current sensors, an interlayer short-circuit determination unit, and a switching unit. The semiconductor fuses are disposed between the vehicle power supply and the respective vehicle auxiliary devices. The current sensors are configured to detect current values flowing through the respective semiconductor fuses. The interlayer short-circuit determination unit is configured to make a determination as to occurrence of an interlayer short-circuit between any of the semiconductor fuses and a corresponding one of the vehicle auxiliary devices, with the use of a first current detection value inputted from a corresponding one of the current sensors and a second current detection value inputted from the corresponding one of the vehicle auxiliary devices. The switching unit is configured to switch the any of the semiconductor fuses from on-operation to off-operation, on the basis of the determination by the interlayer short-circuit determination unit. The interlayer short-circuit determination unit is configured to make the determination as to the occurrence of the interlayer short-circuit on the condition that the second current detection value differs from an allowable value of the first current detection value. The switching unit is configured to switch, to the off-operation, the any of the semiconductor fuses on a path related to the determination as to the occurrence of the interlayer short-circuit.

An aspect of the disclosure provides a vehicle electric power control apparatus configured to control electric power to be supplied to vehicle auxiliary devices from a vehicle power supply mounted on a vehicle. The vehicle electric power control apparatus includes semiconductor fuses, current sensors, and circuitry. The semiconductor fuses are disposed between the vehicle power supply and the respective vehicle auxiliary devices. The current sensors are configured to detect current values flowing through the respective semiconductor fuses. The circuitry is configured to make a determination as to occurrence of an interlayer short-circuit between any of the semiconductor fuses and a corresponding one of the vehicle auxiliary devices, with the use of a first current detection value inputted from a corresponding one of the current sensors and a second current detection value inputted from the corresponding one of the vehicle auxiliary devices. The circuitry is configured to switch the any of the semiconductor fuses from on-operation to off-operation, on the basis of the determination as to the occurrence of the interlayer short-circuit. The circuitry is configured to make the determination as to the occurrence of the interlayer short-circuit on the condition that the second current detection value differs from an allowable value of the first current detection value. The circuitry is configured to switch, to the off-operation, the any of the semiconductor fuses on a path related to the determination as to the occurrence of the interlayer short-circuit.

BRIEF DESCRIPTION OF THE DRAWINGS

The accompanying drawings are included to provide a further understanding of the disclosure, and are incorporated in and constitute a part of this specification. The drawings illustrate embodiments and, together with the specification, serve to explain the principles of the disclosure.

DETAILED DESCRIPTION

Figure 1:
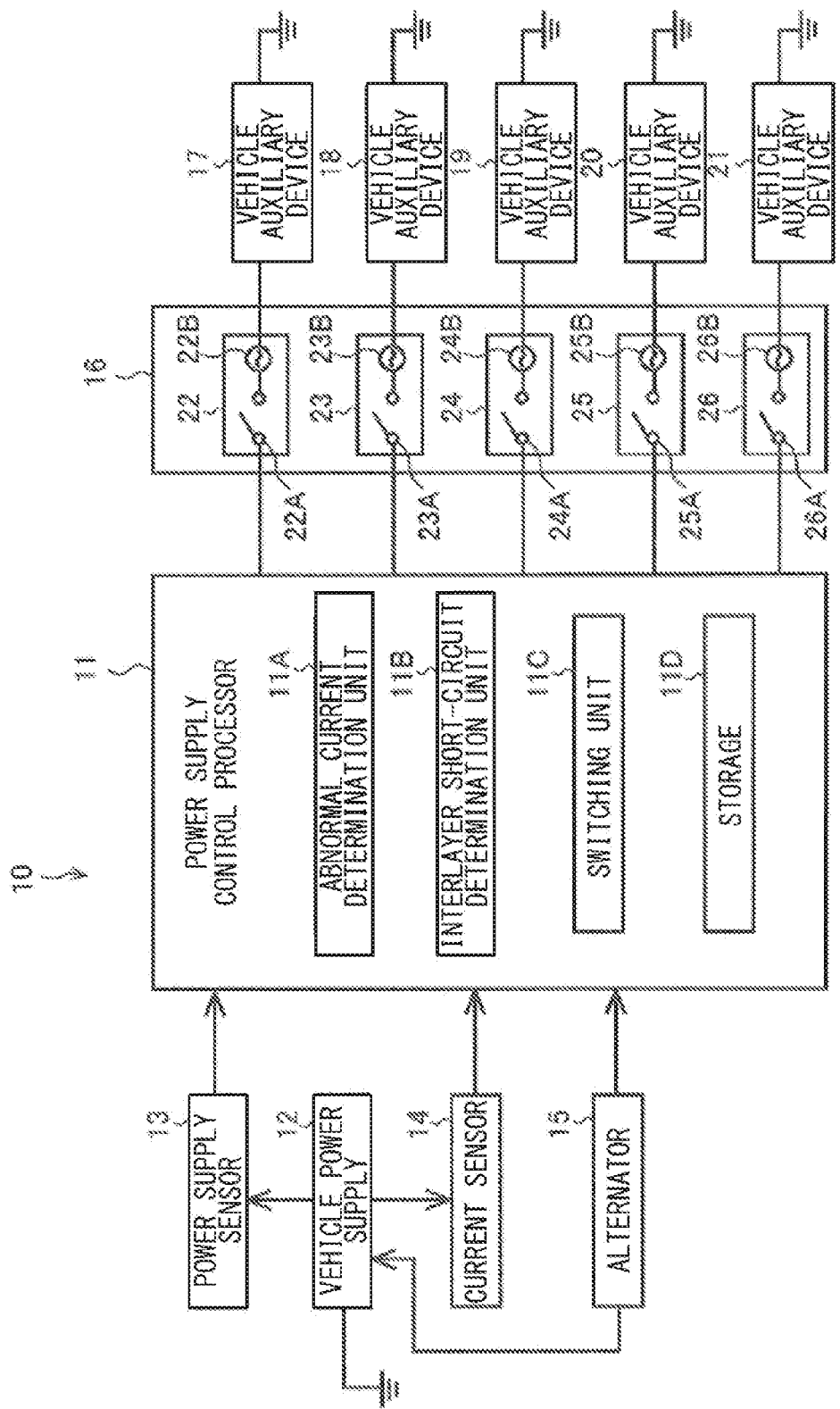
FIG. 1 is a block diagram that illustrates a vehicle electric power control apparatus according to one embodiment of the disclosure.

In an existing vehicle electric power control apparatus, an abnormal current that may possibly damage a wiring causes a rise in a temperature of a PTC element. The rise in the temperature of the PTC element above a resistance critical point causes a rise in electrical resistance of the PTC element. The rise in the electrical resistance of the PTC element causes reduction in the current flowing through the wiring, resulting in reduction in the number of melted fuse elements.

In the vehicle electric power control apparatus, however, in a case with an interlayer short-circuit in an internal circuit such as a wiring, the PTC element sometimes does not generate heat until the temperature of the PTC element exceeds the resistance critical point. In this case, electric power supply to the electric power loads of the vehicle continues, and a current continues to flow through the wiring including the interlayer short-circuit. As a result, the current flowing over a long period of time causes heat generation at the interlayer short-circuit, which may possibly constitute a cause of smoke or a vehicle fire.

That is, in the existing vehicle electric power control apparatus, it is possible to deal with a short-circuit caused by an abnormal current. However, in the case where no abnormal current flows through the wiring because of, for example, the interlayer short-circuit, it is difficult to take countermeasures against, for example, the smoke as mentioned above.

It is desirable to provide a vehicle electric power control apparatus that makes it possible to determine occurrence or nonoccurrence of an interlayer short-circuit in an internal circuit.

In the following, some example embodiments of the disclosure are described in detail with reference to the accompanying drawings. Note that the following description is directed to illustrative examples of the disclosure and not to be construed as limiting to the disclosure. Factors including, without limitation, numerical values, shapes, materials, components, positions of the components, and how the components are coupled to each other are illustrative only and not to be construed as limiting to the disclosure. Further, elements in the following example embodiments which are not recited in a most-generic independent claim of the disclosure are optional and may be provided on an as-needed basis. The drawings are schematic and are not intended to be drawn to scale. Throughout the present specification and the drawings, elements having substantially the same function and configuration are denoted with the same reference numerals to avoid any redundant description. In addition, elements that are not directly related to any embodiment of the disclosure are unillustrated in the drawings.

Figure 2:
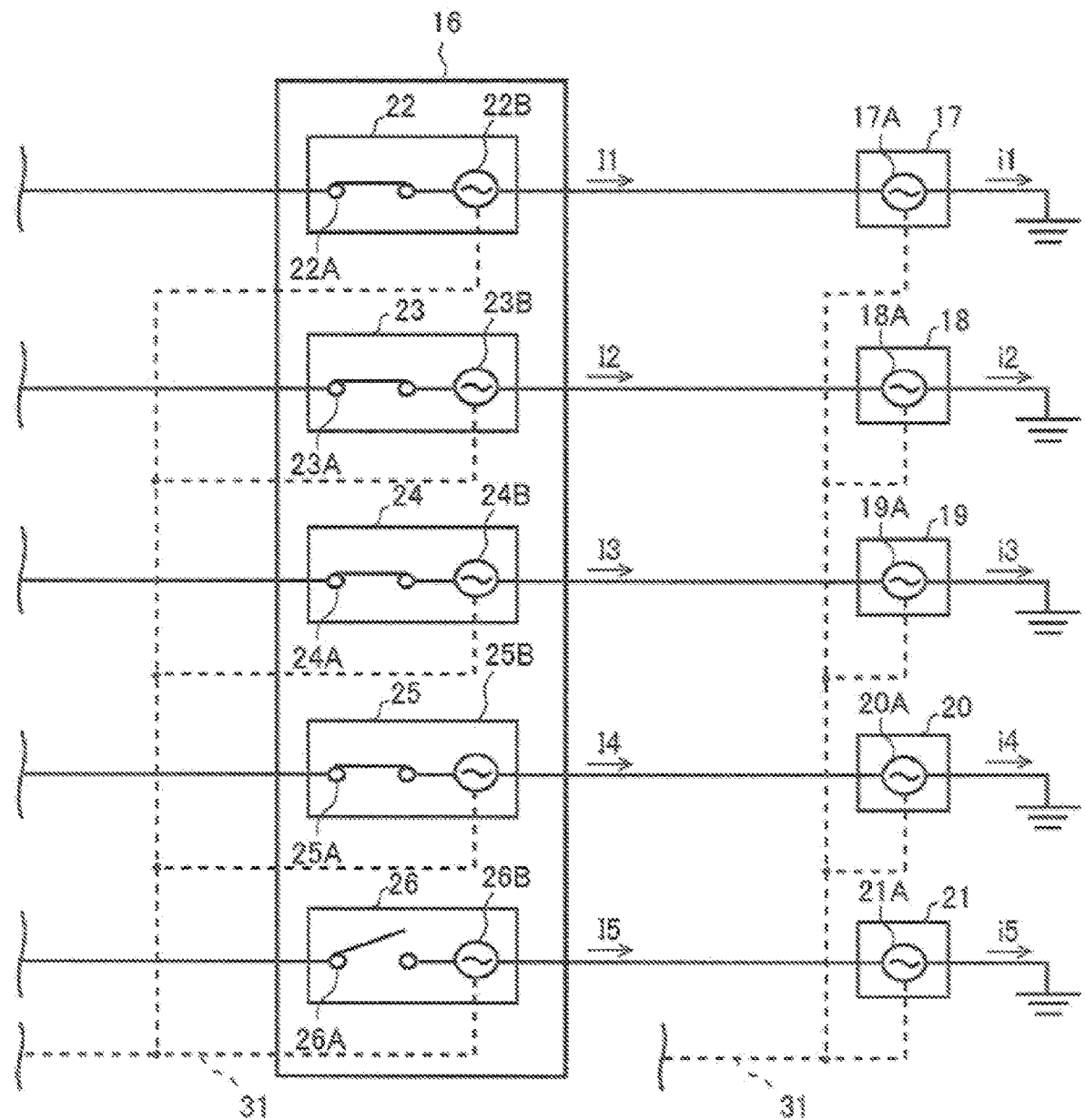
FIG. 2 is a block diagram that illustrates the vehicle electric power control apparatus according to one embodiment of the disclosure.
Figure 3:
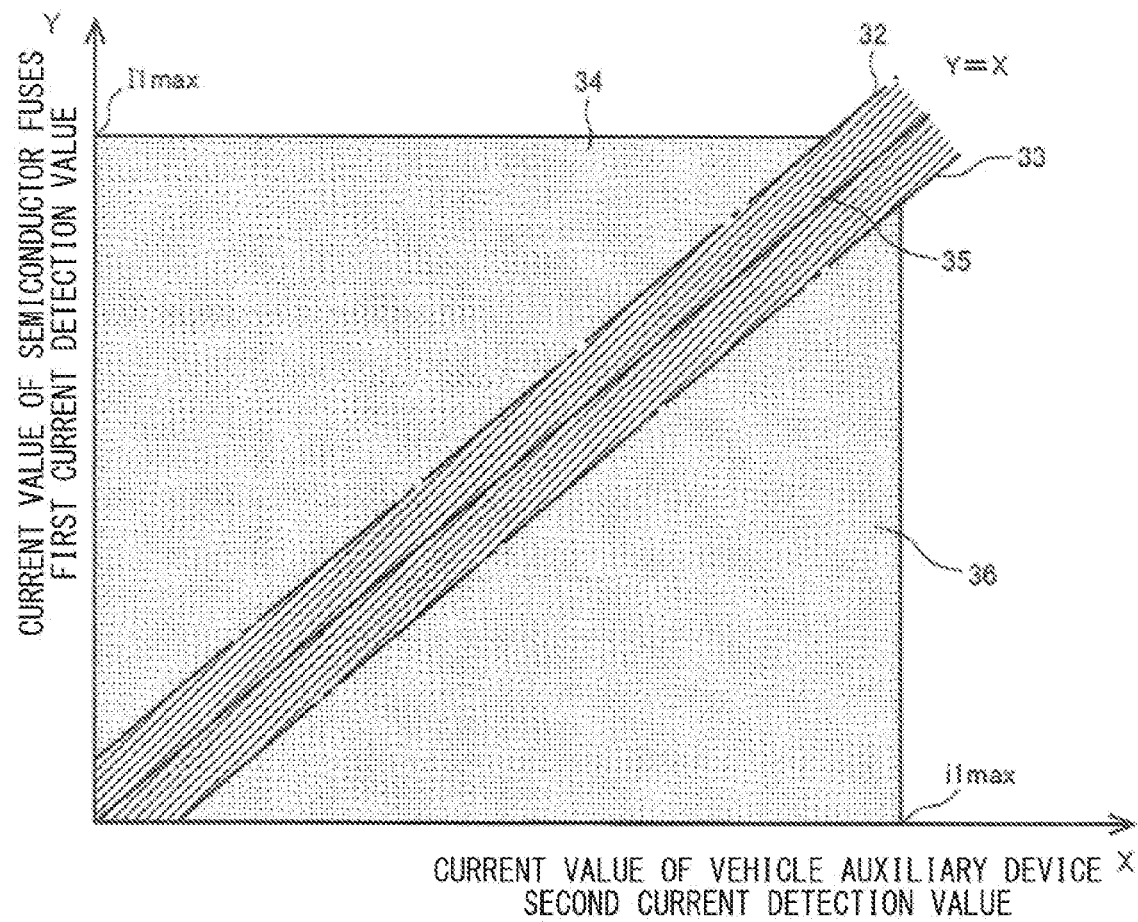
FIG. 3 is a graph that illustrates a method of determining occurrence of an interlayer short-circuit in the vehicle electric power control apparatus according to one embodiment of the disclosure.
Figure 4:
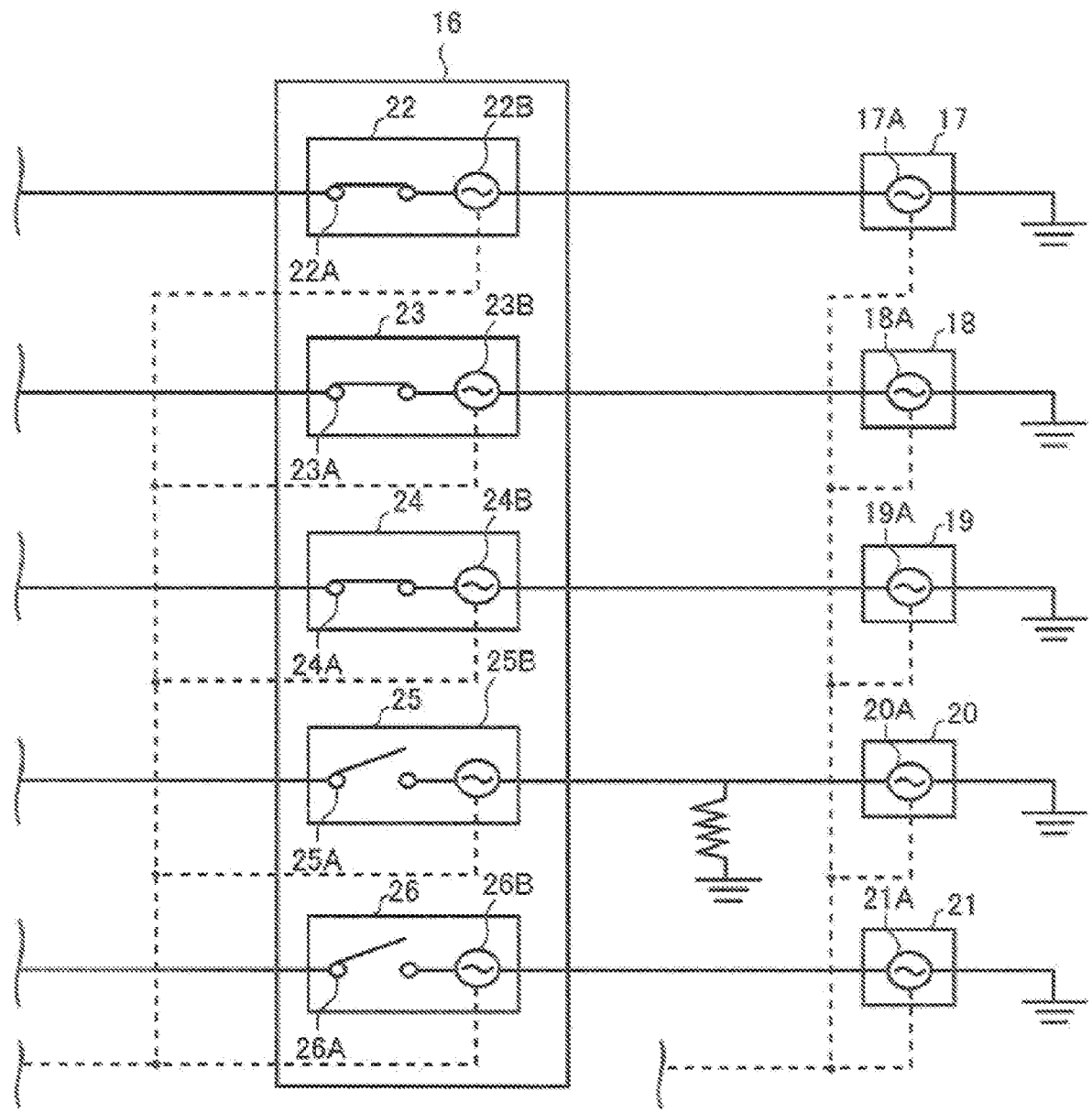
FIG. 4 is a block diagram that illustrates the vehicle electric power control apparatus according to one embodiment of the disclosure.

FIG. 1 is a block diagram that illustrates a vehicle electric power control apparatus 10 according to one embodiment of the disclosure. FIG. 2 is a block diagram that illustrates the vehicle electric power control apparatus 10 according to this embodiment in normal operation. FIG. 3 is a graph that illustrates a method of determining occurrence of an interlayer short-circuit in the vehicle electric power control apparatus 10 according to this embodiment. FIG. 4 is a block diagram that illustrates an operation state of the vehicle electric power control apparatus according to this embodiment in a case with the occurrence of the interlayer short-circuit. FIG. is a flowchart of an electric power control method in the vehicle electric power control apparatus 10 according to this embodiment.

As illustrated in FIG. 1, the vehicle electric power control apparatus 10 may include, for example, a power supply control processor 11, a vehicle power supply 12, a power supply sensor 13, a current sensor 14, an alternator 15, a relay unit 16, and vehicle auxiliary devices 17, 18, 19, 20, and 21. Although not illustrated, the power supply control processor 11 is coupled to an engine through a cell motor, and configured to supply electric power to the engine and control driving of the engine.

The power supply control processor 11 may include, for example, a CPU (Central Processing Unit), a ROM (Read Only Memory), and a RAM (Random Access Memory). The power supply control processor 11 may include an electronic control unit (ECU) including one or more processors configured to carry out, for example, various kinds of calculation to control the relay unit 16 and supply electric power outputted from the vehicle power supply 12 to the vehicle auxiliary devices 17 to 21.

The power supply control processor 11 may include a storage 11D. The storage 11D may include a nonvolatile memory such as an EEPROM (Electrically Erasable Programmable Read-Only Memory). The storage 11D holds various kinds of data to be involved in a control of the relay unit 16, and one or more programs to be executed by the one or more processors.

The power supply control processor 11 may include, for example, an abnormal current determination unit 11A, an interlayer short-circuit determination unit 11B, a switching unit 11C, and the storage 11D. The power supply control processor 11 is communicably coupled to the relay unit 16 and the vehicle auxiliary devices 17 to 21 through an in-vehicle network 31 (see FIG. 2) such as a CAN (Controller Area Network) or a LAN (Local Area Network).

The abnormal current determination unit 11A makes a determination as to whether or not an abnormal current has flowed through the vehicle electric power control apparatus 10 with the use of first current detection values. The first current detection values are detected by current sensors 22B, 23B, 24B, 25B, and 26B of respective semiconductor modules 22, 23, 24, 25, and 26 of the relay unit 16. The abnormal current determination unit 11A acquires the first current detection values through the in-vehicle network 31.

In this embodiment, the abnormal current determination unit 11A makes a determination that the abnormal current has flowed through the vehicle electric power control apparatus 10, in a case where a current value flowing through any of the semiconductor fuses 22A, 23A, 24A, 25A, and 26A is larger than a preset first threshold value. In a case where the relevant one of the semiconductor fuses 22A to 26A of the wiring related to the determination is in on-operation, the switching unit 11C switches the relevant one of the semiconductor fuses 22A to 26A to off-operation. This suppresses the abnormal current from flowing to a corresponding one of the vehicle auxiliary devices 17 to 21, leading to suppression of damages to the vehicle auxiliary devices 17 to 21 and the semiconductor fuses 22A to 26A.

The vehicle auxiliary devices 17 to 21 differ in the current values flowing therethrough, depending on the kinds of the vehicle auxiliary devices 17 to 21. Accordingly, the first threshold values are set in advance for the respective semiconductor fuses 22A to 26A corresponding to the vehicle auxiliary devices 17 to 21. For example, the first threshold values are set to values larger than maximum current values flowing through the respective semiconductor fuses 22A to 26A in a normal state.

The interlayer short-circuit determination unit 11B makes a determination as to occurrence or nonoccurrence of an interlayer short-circuit in an internal circuit of the vehicle electric power control apparatus 10, with the use of the first current detection values and second current detection values. The second current detection values are detected by current sensors 17A, 18A, 19A, 20A, and 21A (see FIG. 2) incorporated in the vehicle auxiliary devices 17 to 21. The interlayer short-circuit determination unit 11B acquires the first current detection values and the second current detection values through the in-vehicle network 31. A determination method of the occurrence of the interlayer short-circuit in the interlayer short-circuit determination unit 11B is described later with reference to FIG. 3.

The switching unit 11C may include, for example, logic elements and transistors. The switching unit 11C is configured to switch the semiconductor fuses 22A to 26A of the semiconductor modules 22 to 26 between the on-operation and the off-operation. The switching unit 11C is configured to switch the semiconductor fuses 22A to 26A from the on-operation to the off-operation on the basis of a determination result from the abnormal current determination unit 11A or the interlayer short-circuit determination unit 11B.

The vehicle power supply 12 may include, for example, a battery pack in which unillustrated battery modules are housed. The vehicle power supply 12 outputs a power supply voltage of, for example, 12.6 V. The power supply voltage from the vehicle power supply 12 is supplied to, for example, the vehicle auxiliary devices 17 to 21 through, for example, the current sensor 14. The current sensor 14 may include, for example, a resistor for current detection, e.g., a shunt resistor.

The power supply sensor 13 measures, for example, a capacity, a voltage, a temperature, internal resistance, and a current characteristic of the vehicle power supply 12. The power supply sensor 13 inputs the measured values to the power supply control processor 11 and stores the measured values in the storage 11D.

The alternator 15 carries out electric power generation in accordance with rotation of the unillustrated engine, and supplies a charging current generated by the electric power generation to the vehicle power supply 12 under a control by the power supply control processor 11. An output voltage from the alternator 15 may be, for example, about 14 V.

The relay unit 16 may include the semiconductor modules 22 to 26 respectively corresponding to the vehicle auxiliary devices 17 to 21. The semiconductor modules 22 to 26 may include respectively the semiconductor fuses 22A to 26A and the current sensors 22B to 26B. The relay unit 16 is controlled by the power supply control processor 11. Current supply to the vehicle auxiliary devices 17 to 21 is controlled by switching the semiconductor fuses 22A to 26A to the on-operation or the off-operation.

The semiconductor fuses 22A to 26A may each include, for example, a power MOSFET (Metal Oxide Semiconductor Field Effect Transistor). The power MOSFET is controlled by the switching unit 11C, and is brought into the on-operation or the off-operation by a control of a voltage to be applied to a gate terminal. Bringing the semiconductor fuses 22A to 26A into the on-operation causes electric power supply from the vehicle power supply 12 to the vehicle auxiliary devices 17 to 21. The semiconductor fuses 22A to 26A are not limited to the power MOSFETs, but may include IGBTs (Insulated Gate Bipolar Transistors) or bipolar transistors.

The current sensors 22B to 26B are disposed, for example, downstream of the semiconductor fuses 22A to 26A, and configured to detect current values flowing through the semiconductor fuses 22A to 26A. The current sensors 22B to 26B input the detected current values as the first current detection values to the power supply control processor 11 through the in-vehicle network 31. The current sensors 22B to 26B may be disposed upstream of the semiconductor fuses 22A to 26A.

The vehicle auxiliary devices 17 to 21 to be mounted on the vehicle are roughly classified into, for example, loads that provide safe travel performance of the vehicle and other loads, e.g., loads that provide comfort of an occupant of the vehicle. The vehicle auxiliary devices 17 to 21 are coupled to the vehicle power supply 12 respectively through the semiconductor fuses 22A to 26A. The vehicle auxiliary devices 17 to 21 are brought into the on-operation by the electric power supply from the vehicle power supply 12.

In this embodiment, the vehicle auxiliary device 17 may include, for example, an electric brake. The vehicle auxiliary device 18 may include, for example, an electric power steering. The vehicle auxiliary device 19 may include, for example, a skid prevention device. The vehicle auxiliary device 20 may include, for example, an air conditioner. The vehicle auxiliary device 21 may include, for example, a seat heater. The vehicle may include many other vehicle auxiliary devices that are brought into the on-operation by the electric power supply from the vehicle power supply 12 as with the vehicle auxiliary devices 17 to 21.

FIG. 2 illustrates a state in which the vehicle auxiliary devices 17 to 20 are in the on-operation, the vehicle auxiliary devices 21 is in the off-operation, and the vehicle electric power control apparatus 10 is in normal operation. As described, the switching unit 11C of the power supply control processor 11 applies a driving voltage to the semiconductor fuses 22A to 25A of the semiconductor modules 22 to 25, to bring the semiconductor fuses 22A to 25A into the on-operation. The vehicle auxiliary devices 17 to 20 are brought into the on-operation by the electric power supply from the vehicle power supply 12.

The current sensors 22B to 26B of the semiconductor fuses 22A to 26A detect current values I1 to I5 flowing through the respective semiconductor fuses 22A to 26A. The current sensors 22B to 26B input the detected current values I1 to I5 as the first current detection values to the power supply control processor 11 through the in-vehicle network 31 indicated by dotted lines. The first current detection values are held in the storage 11D. At this occasion, in the current sensor 26B, the semiconductor fuse 26A is in the off-operation, and no current flows. Accordingly, in the current sensor 26B, the first current detection value becomes zero (0).

As described, the abnormal current determination unit 11A may compare the first current detection values held in the storage 11D with the first threshold values held in advance in the storage 11D, to make the determination as to whether or not an abnormal current has flowed through each of the semiconductor fuses 22A to 26A.

The current sensors 17A to 21A incorporated in the vehicle auxiliary devices 17 to 21 detect current values i1 to i5 flowing through the respective vehicle auxiliary devices 17 to 21. The current sensors 17A to 21A input the detected current values i1 to i5 as the second current detection values to the power supply control processor 11 through the in-vehicle network 31 indicated by dotted lines. The second current detection values are held in the storage 11D. At this occasion, in the current sensor 21A, the semiconductor fuse 26A is in the off-operation, and no current flows to the vehicle auxiliary device 21. Accordingly, in the current sensor 21A, the second current detection value becomes zero (0).

In FIG. 3, the Y-axis represents the current values I1 to I5 flowing through the semiconductor fuses 22A to 26A, and the X-axis represents the current values i1 to i5 flowing through the vehicle auxiliary devices 17 to 21. As described, the vehicle auxiliary devices 17 to 21 differ in the current values i1 to i5 flowing therein, depending on the kinds of the vehicle auxiliary devices 17 to 21. Accordingly, FIG. 3 illustrates the current value flowing through the vehicle auxiliary device 17 as an example. The following description of the example of the vehicle auxiliary device 17 also applies to the other vehicle auxiliary devices 18 to 21, and description thereof is omitted.

As illustrated in the figure, the current values I1 to I5 and the current values i1 to i5 are equal to each other on a line of a linear function Y=X. Above and below the line of the linear function Y=X, allowable value lines 32 and 33 are drawn, as indicated by long dashed short dashed lines, in consideration of allowable values. The allowable values are set in advance in consideration of measurement errors on the occasion of detection by the current sensors 22B and 17A and wiring resistance between the current sensors 22B and 17A.

The interlayer short-circuit determination unit 11B of this embodiment may compare the first current detection value from the current sensor 22B with the second current detection value from the current sensor 17A. In a case where a value obtained by subtracting the second current detection value from the first current detection value is larger than the allowable value, the interlayer short-circuit determination unit 11B makes a determination as to occurrence of an interlayer short-circuit in a wiring between the current sensors 22B and 17A.

In one example, in a case where plotted values of the first current detection value and the second current detection value to be compared are located in a sandy hatched region 34, the interlayer short-circuit determination unit 11B makes the determination as to the occurrence of the interlayer short-circuit in the wiring between the current sensors 22B and 17A. In contrast, in a case where the plotted values of the first current detection value and the second current detection value to be compared are located in an obliquely hatched region 35 between the line of the linear function Y=X and the allowable value line 32, the interlayer short-circuit determination unit 11B makes a determination as to nonoccurrence of an interlayer short-circuit in the wiring between the current sensors 22B and 17A.

It is to be noted that the reference characters I1max means a maximum current value flowing through the semiconductor fuse 22A during the normal operation of the vehicle electric power control apparatus 10. The reference characters i1max means a maximum current value flowing through the vehicle auxiliary device 17 during the normal operation of the vehicle electric power control apparatus 10. As described, as the first threshold value to be used in the abnormal current determination unit 11A, for example, a value larger than the maximum current value I1max flowing through the current sensor 22B may be set in advance.

FIG. 4 illustrates the operation state of the vehicle electric power control apparatus 10 in a case where the vehicle electric power control apparatus 10 illustrated in FIG. 2 is in the normal operation, but an interlayer short-circuit occurs in a wiring for the electric power supply to the vehicle auxiliary device 20.

Description is given of an interlayer short-circuit in this embodiment. The vehicle power supply 12 and the vehicle auxiliary devices 17 to 21 are electrically coupled through wire harnesses, whereby electric power is supplied from the vehicle power supply 12 to the vehicle auxiliary devices 17 to 21. Because the wire harnesses are wired fixedly along a vehicle body, the wire harnesses are repetitively rubbed against the vehicle body because of, for example, vibrations during travel of the vehicle, causing insulating films on their surfaces to be partly peeled off. As a result, the wire harnesses and the vehicle body become electrically coupled, causing a minute leakage current between them.

In the existing techniques, in the case with such a minute leakage current in the way of the wire harnesses, unlike a case with a complete short-circuit of a wiring, electric power is continuously supplied from the vehicle power supply 12 to the vehicle auxiliary devices 17 to 21. Thus, in the wire harnesses, the minute leakage current continues to be generated for a long period of time, causing heat generation at the position of the leak. This possibly results in smoke or a vehicle fire afterwards.

Thus, as illustrated in FIG. 4, in this embodiment, in the case where the interlayer short-circuit determination unit 11B determines the occurrence of an interlayer short-circuit in the wiring between the current sensors 25B and 20A in the wiring of the vehicle auxiliary device 20, the switching unit 11C forcibly switches the semiconductor fuse 25A to the off-operation. As a result, the electric power supply from the vehicle power supply 12 to the vehicle auxiliary device stops, leading to suppression of heat generation at the position of the interlayer short-circuit in the wiring. This suppresses smoke or a vehicle fire afterwards.

Meanwhile, because the wirings of the vehicle auxiliary devices 17 to 19 are in the normal operation without the occurrence of an interlayer short-circuit, the electric power supply from the vehicle power supply 12 continues. The occurrence of the interlayer short-circuit in the wiring of the vehicle auxiliary device 20 is held in the storage 11D of the power supply control processor 11.

Figure 5:
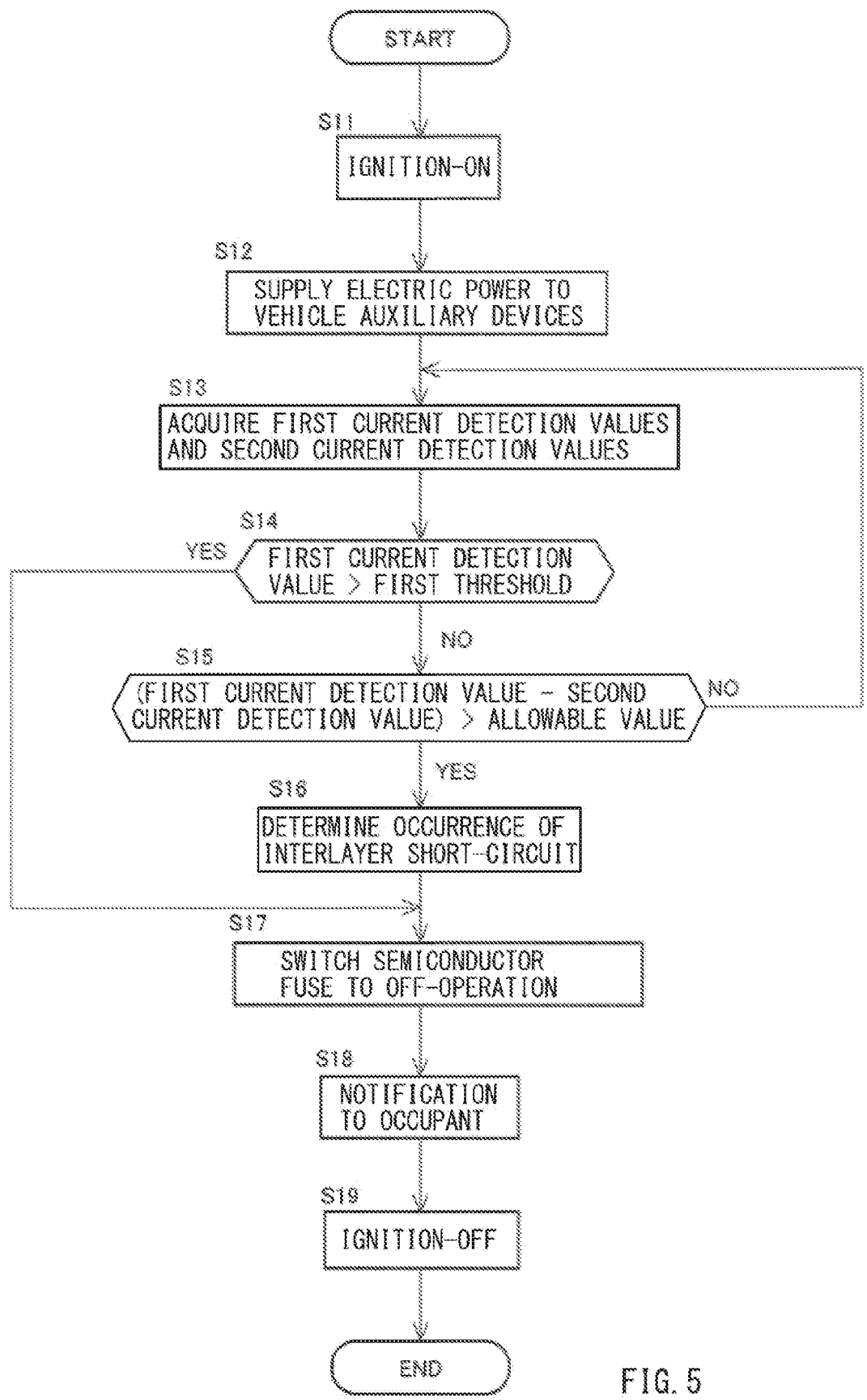
FIG. 5 is a flowchart of an electric power control method in the vehicle electric power control apparatus according to one embodiment of the disclosure.

As illustrated in FIG. 5, in step S11, an occupant such as a driver gets on the vehicle and presses an unillustrated ignition switch, and thereupon, the vehicle is brought into an ignition-on state. In step S12, the power supply control processor 11 starts the electric power supply from the vehicle power supply 12 to the vehicle auxiliary devices 17 to 21 in accordance with driving states of the vehicle auxiliary devices 17 to 21 of the vehicle.

In step S13, the current sensors 22B to 26B of the relay unit 16 detect the respective current values I1 to I5 flowing through the semiconductor fuses 22A to 26A. The current sensors 22B to 26B input the detected current values I1 to I5 as the first current detection values to the power supply control processor 11 through the in-vehicle network 31.

Similarly, the current sensors 17A to 21A incorporated in the vehicle auxiliary devices 17 to 21 detect the respective current values i1 to i5 flowing through the vehicle auxiliary devices 17 to 21. The current sensors 17A to 21A input the detected current values i1 to i5 as the second current detection values to the power supply control processor 11 through the in-vehicle network 31.

In step S14, the abnormal current determination unit 11A of the power supply control processor 11 compares the first current detection values held in the storage 11D with the first threshold values. In affirmation (YES) in step S14, in a case where the abnormal current determination unit 11A determines that any of the first current detection values is larger than the corresponding one of the first threshold values, the flow proceeds to step S17. In step S17, the abnormal current determination unit 11A determines the occurrence of an abnormal current inside the vehicle electric power control apparatus 10. The switching unit 11C switches, to the off-operation, a corresponding one of the semiconductor fuses 22A to 26A in the wiring where the abnormal current has occurred.

Meanwhile, in negation (NO) in step S14, in a case where the abnormal current determination unit 11A determines that the first current detection values are smaller than the first threshold values, the flow proceeds to step S15. In step S15, the abnormal current determination unit 11A determines nonoccurrence of an abnormal current inside the vehicle electric power control apparatus 10.

Thereafter, in step S15, the interlayer short-circuit determination unit 11B of the power supply control processor 11 determines the occurrence or the nonoccurrence of an interlayer short-circuit, with the use of the first current detection values and the second current detection values held in the storage 11D. In affirmation (YES) in step S15, the interlayer short-circuit determination unit 11B determines that the value obtained by subtracting the second current detection value from the first current detection value is larger than the allowable value, and causes the flow to proceed to step S16.

In step S16, the interlayer short-circuit determination unit 11B determines the occurrence of an interlayer short-circuit in the wiring in which the first current detection value and the second current detection value satisfy the condition as mentioned above, and causes the flow to proceed to step S17. In step S17, the switching unit 11C switches, to the off-operation, the corresponding one of the semiconductor fuses 22A to 26A in the wiring where the interlayer short-circuit has occurred.

Meanwhile, in negation (NO) in step S15, the interlayer short-circuit determination unit 11B determines that the value obtained by subtracting the second current detection value from the first current detection value is equal to or smaller than the allowable value as mentioned above, and causes the flow to return to step S13. In this case, the vehicle electric power control apparatus 10 is in the normal operation, and the power supply control processor 11 keeps on monitoring continuously the occurrence of an abnormal current and the occurrence of an interlayer short-circuit.

In step S18, the power supply control processor 11 notifies the occupant of the vehicle of an abnormality of the vehicle electric power control apparatus 10, by displaying the occurrence of an abnormal current or the occurrence of an interlayer short-circuit on a multifunction display device, or putting on an alarm lamp or generating an alarm sound or voice.

In step S19, the occupant of the vehicle recognizes the abnormality of the vehicle electric power control apparatus 10 by the notification, and stops the vehicle at a safe place such as a road shoulder of a road or a parking lot nearby. After stopping the vehicle, the occupant of the vehicle presses the ignition switch, to bring the vehicle into an ignition-off state.

It is to be noted that, in this embodiment, as illustrated in FIG. 3, the interlayer short-circuit determination unit 11B determines the occurrence of an interlayer short-circuit in a target wiring, in the case where the plotted values of the first current detection value and the second current detection value to be compared are located in the sandy hatched region 34. However, this is non-limiting. For example, the interlayer short-circuit determination unit 11B may determine the occurrence of an interlayer short-circuit in a target wiring, in a case where the plotted values of the first current detection value and the second current detection value to be compared are located in a sandy hatched region 36. In the normal operation of the vehicle electric power control apparatus 10, in a circuit configuration in which the current sensor 17A is located downstream of the current sensor 22B, the current values i1 to i5 do not become larger than the current values I1 to I5. If such a phenomenon occurs, it is presumed that some unexpected incident has occurred in the vehicle electric power control apparatus 10. Thus, switching, to the off-operation, the corresponding one of the semiconductor fuses 22A to 26A in the target wiring makes it possible to protect, for example, the semiconductor fuses 22A to 26A and the vehicle auxiliary devices 17 to 21.

Moreover, description is given of a case where the current sensors 17A to 21A are incorporated in the vehicle auxiliary devices 17 to 21. However, this is non-limiting. For example, externally attached current sensors may be electrically coupled to upstream or downstream of the vehicle auxiliary devices 17 to 21 to detect the current values i1 to i5 flowing through the vehicle auxiliary devices 17 to 21.

Although some example embodiments of the disclosure have been described in the foregoing by way of example with reference to the accompanying drawings, the disclosure is by no means limited to the embodiments described above. It should be appreciated that modifications and alterations may be made by persons skilled in the art without departing from the scope as defined by the appended claims. The disclosure is intended to include such modifications and alterations in so far as they fall within the scope of the appended claims or the equivalents thereof.

According to a vehicle electric power control apparatus of an embodiment of the disclosure, an interlayer short-circuit determination unit is configured to compare a first current detection value with a second current detection value. The first current detection value is a current value flowing through any of semiconductor fuses. The second current detection value is a current value flowing through a corresponding one of the vehicle auxiliary devices. Thus, the interlayer short-circuit determination unit is configured to determine occurrence or nonoccurrence of an interlayer short-circuit in a wiring between the relevant one of the semiconductor fuses and the corresponding one of the vehicle auxiliary devices. In a case with the occurrence of an interlayer short-circuit in the wiring between the relevant one of the semiconductor fuses and the corresponding one of the vehicle auxiliary devices, a switching unit is configured to switch the relevant one of the semiconductor fuses coupled to the wiring, from on-operation to off-operation, to cut off the current flowing toward the corresponding one of the vehicle auxiliary devices. Hence, it is possible to suppress heat generation of the wiring where the interlayer short-circuit has occurred, leading to suppression of smoke or a vehicle fire afterwards.

The power supply control processor 11 illustrated in FIG. 1 is implementable by circuitry including at least one semiconductor integrated circuit such as at least one processor (e.g., a central processing unit (CPU)), at least one application specific integrated circuit (ASIC), and/or at least one field programmable gate array (FPGA). At least one processor is configurable, by reading instructions from at least one machine readable non-transitory tangible medium, to perform all or a part of functions of the power supply control processor 11. Such a medium may take many forms, including, but not limited to, any type of magnetic medium such as a hard disk, any type of optical medium such as a CD and a DVD, any type of semiconductor memory (i.e., semiconductor circuit) such as a volatile memory and a non-volatile memory. The volatile memory may include a DRAM and a SRAM, and the nonvolatile memory may include a ROM and a NVRAM. The ASIC is an integrated circuit (IC) customized to perform, and the FPGA is an integrated circuit designed to be configured after manufacturing in order to perform, all or a part of the functions of the power supply control processor 11 illustrated in FIG. 1.

The invention claimed is:

1. A vehicle electric power control apparatus configured to control electric power to be supplied to vehicle auxiliary devices from a vehicle power supply mounted on a vehicle, the vehicle electric power control apparatus comprising:
semiconductor fuses disposed between the vehicle power supply and the respective vehicle auxiliary devices;
current sensors configured to detect current values flowing through the respective semiconductor fuses;
an interlayer short-circuit determination unit configured to make a determination as to occurrence of an interlayer short-circuit between any of the semiconductor fuses and a corresponding one of the vehicle auxiliary devices, with use of a first current detection value inputted from a corresponding one of the current sensors and a second current detection value inputted from the corresponding one of the vehicle auxiliary devices; and a switching unit configured to switch the any of the semiconductor fuses from on-operation to off-operation, on a basis of the determination by the interlayer short-circuit determination unit, wherein the interlayer short-circuit determination unit is configured to make the determination as to the occurrence of the interlayer short-circuit on a condition that the second current detection value differs from an allowable value of the first current detection value, and the switching unit is configured to switch, to the off-operation, the any of the semiconductor fuses on a path related to the determination as to the occurrence of the interlayer short-circuit.

2. The vehicle electric power control apparatus according to claim 1, further comprising an abnormal current determination unit configured to determine an abnormal current flowing through the any of the semiconductor fuses, with use of the first current detection value, wherein the abnormal current determination unit is configured to make a determination as to occurrence of the abnormal current, on a condition that the first current detection value is larger than a first threshold, and the switching unit is configured to switch, to the off-operation, the any of the semiconductor fuses on a path related to the determination as to the occurrence of the abnormal current.

3. The vehicle electric power control apparatus according to claim 2, wherein on a condition that the abnormal current determination unit makes a determination as to nonoccurrence of the abnormal current, when the interlayer short-circuit determination unit makes the determination as to the occurrence of the interlayer short-circuit, the switching unit is configured to switch, to the off-operation, the any of the semiconductor fuses on the path related to the determination as to the occurrence of the interlayer short-circuit.

4. A vehicle electric power control apparatus configured to control electric power to be supplied to vehicle auxiliary devices from a vehicle power supply mounted on a vehicle, the vehicle electric power control apparatus comprising:

semiconductor fuses disposed between the vehicle power supply and the respective vehicle auxiliary devices;

current sensors configured to detect current values flowing through the respective semiconductor fuses; and circuitry configured to make a determination as to occurrence of an interlayer short-circuit between any of the semiconductor fuses and a corresponding one of the vehicle auxiliary devices, with use of a first current detection value inputted from a corresponding one of the current sensors and a second current detection value inputted from the corresponding one of the vehicle auxiliary devices, and switch the any of the semiconductor fuses from on-operation to off-operation, on a basis of the determination as to the occurrence of the interlayer short-circuit, wherein the circuitry is configured to make the determination as to the occurrence of the interlayer short-circuit on a condition that the second current detection value differs from an allowable value of the first current detection value, and the circuitry is configured to switch, to the off-operation, the any of the semiconductor fuses on a path related to the determination as to the occurrence of the interlayer short-circuit.

* * * * *